United States Patent
Bolz

(10) Patent No.: US 9,677,533 B2
(45) Date of Patent: Jun. 13, 2017

(54) APPARATUS FOR OPERATING AT LEAST ONE LIGHT-EMITTING DIODE IN THE FORM OF A LASER DIODE

(71) Applicant: CONTINENTAL AUTOMOTIVE GMBH, Hannover (DE)

(72) Inventor: Stephan Bolz, Pfatter (DE)

(73) Assignee: Continental Automotive GmbH, Hannover (DE)

( * ) Notice: Subject to any disclaimer, the term of this patent is extended or adjusted under 35 U.S.C. 154(b) by 345 days.

(21) Appl. No.: 14/464,882

(22) Filed: Aug. 21, 2014

(65) Prior Publication Data
US 2015/0053163 A1 Feb. 26, 2015

(30) Foreign Application Priority Data
Aug. 21, 2013 (DE) .......................... 10 2013 216 552

(51) Int. Cl.
*H01S 5/042* (2006.01)
*F02P 23/04* (2006.01)
(Continued)

(52) U.S. Cl.
CPC ............ *F02P 23/04* (2013.01); *H01S 5/0261* (2013.01); *H01S 5/0428* (2013.01);
(Continued)

(58) Field of Classification Search
CPC . F02P 23/04; F02P 7/02; H01S 5/0261; H01S 5/0428; H01S 5/4018; H01S 5/06808; H01S 5/4025
See application file for complete search history.

(56) References Cited

U.S. PATENT DOCUMENTS 5,736,881 A * 4/1998 Ortiz ....................... H01S 5/042
323/269
7,087,882 B1 * 8/2006 Dries ................... H01L 31/1075
250/214 R
(Continued)

FOREIGN PATENT DOCUMENTS

DE 102006036167 A1 2/2008
DE 102007041839 A1 3/2009
(Continued)

OTHER PUBLICATIONS

Heinrich Kofler et al., "Konzeption and Entwicklung einer Laserzündkerze", Institut für Photonik, TU Wien—Statement of Relevance.

*Primary Examiner* — Xinning Niu
(74) *Attorney, Agent, or Firm* — Laurence A. Greenberg; Werner H. Stemer; Ralph E. Locher

(57) ABSTRACT

An apparatus operates at least one light-emitting diode in the form of a laser diode. The light-emitting diode is interconnected in series with the load section of a controllable semiconductor element and a current measuring resistor between a first supply voltage terminal and a second supply voltage terminal. The supply voltage terminals are the output connections of a voltage-regulating circuit in the form of a DC voltage boost converter which provides a supply voltage), and wherein a current-regulating circuit is provided for the current through the at least one light-emitting diode, whose actuator is the controllable semiconductor element.

8 Claims, 3 Drawing Sheets

(51) Int. Cl.
  *H01S 5/026* (2006.01)
  *H01S 5/40* (2006.01)
  *F02P 7/02* (2006.01)
  *H01S 5/068* (2006.01)

(52) U.S. Cl.
  CPC .............. *H01S 5/4018* (2013.01); *F02P 7/02* (2013.01); *H01S 5/06808* (2013.01); *H01S 5/4025* (2013.01)

(56) References Cited

U.S. PATENT DOCUMENTS

| | | |
|---|---|---|
| 8,314,572 B2 | 11/2012 | Schindler et al. |
| 8,378,957 B2 | 2/2013 | Santo et al. |
| 8,493,300 B2 | 7/2013 | Santo et al. |
| 8,581,810 B2 | 11/2013 | Dhayagude et al. |
| 2003/0205949 A1 | 11/2003 | Rueger et al. |

FOREIGN PATENT DOCUMENTS

| | | |
|---|---|---|
| DE | 202009008337 U1 | 8/2009 |
| DE | 112010005040 T5 | 10/2012 |
| EP | 1139443 A1 | 10/2001 |
| WO | 2009030548 A2 | 3/2009 |
| WO | 2010142708 A2 | 12/2010 |

\* cited by examiner

APPARATUS FOR OPERATING AT LEAST ONE LIGHT-EMITTING DIODE IN THE FORM OF A LASER DIODE

CROSS-REFERENCE TO RELATED APPLICATION

This application claims the priority, under 35 U.S.C. §119, of German application DE 10 2013 216 552.8, filed Aug. 21, 2013; the prior application is herewith incorporated by reference in its entirety.

BACKGROUND OF THE INVENTION

Field of the Invention

In the course of use optimization, at present combustion methods for Otto engines are being developed which are intended to substantially improve the degree of efficiency. In the process, the aim is to develop operating points of the engine which until now have not been achievable for technical reasons, such as, for example, making the fuel mix much leaner by supplying a high exhaust gas component (exhaust gas return) given at the same time a very high charging pressure of the turbocharger (>2 bar). Under such conditions, the fuel mix is still combustible, but is very difficult to ignite. The low oxygen content/high nitrogen content also delays the beginning of the endothermic combustion process once exothermic ignition has taken place, with the result that the time of the maximum combustion chamber pressure fluctuates greatly. This results in unsteady engine running, wherein misfiring can be observed which imposes marked limits on the leaning process.

At present, on the basis of conventional magneto ignition, high-performance ignition systems are used whose ignition energy has at present increased from 50 mJ to 70 mJ to above 100 mJ. Technical difficulties in this case consist in increased high voltage strength, however, owing to the higher ignition pressure and increased electrode wear on the spark plugs, caused by the increased ignition currents. Alternatively, in the past ignition concepts have already been investigated in which ignition of the fuel mix is based on the generation of much shorter, extremely energy-rich laser pulses in the combustion chamber. It could be demonstrated in that case that such laser ignition is particularly well suited to the above-described difficult ignition conditions. This is described, for example, in the article entitled "Design and Development of a Laser Spark Plug" by Heinrich Kofler, Johannes Tauer, Ernst Wintner, Institut für Photonik, TU Vienna.

A laser ignition system contains one or more semiconductor lasers, which are used as pumped lasers and emit short laser pulses of approximately 300 µs in duration. A glass fiber conducts the light pulses to a laser spark plug installed in the engine, which laser spark plug consists of a neodymium YAG laser, which is provided, towards the combustion chamber, with a Q switch, a focusing optical element and an optical window. If the inversion level of the neodymium YAG laser is completely populated, the Q switch fades and the optical energy escapes in the direction of the combustion chamber as an extremely short pulse of a few nanoseconds in duration. The optical element focuses the pulse within the combustion chamber and the energy produced in the process results in non-resonant ionization of the mix molecules. This takes place all the more efficiently the higher the particle density, i.e. the higher the ignition pressure. In general, a pumped laser, a glass fiber and a laser spark plug are used for each cylinder of the internal combustion engine. For ignition purposes, the respectively corresponding pumped laser is activated by a suitable semiconductor switch. The electric power for operation is generally at approximately 100 W, but an instantaneous power of up to 2 kW is required during the pumped pulse. Laser modules which are available nowadays have an operating voltage of typically 9 to 12 V, which makes operating currents of up to 250 A necessary, wherein, in the case of some laser modules, a plurality of lasers are combined to form one module in order to achieve the required power.

Published, non-prosecuted German patent application DE 10 2007 041 839 A1 discloses an apparatus for operating semiconductor lasers suitable for pumping laser spark plugs, wherein a number of semiconductor lasers are connected in series and operated on a supply voltage which is supplied from the motor vehicle battery by a current-regulated, clocked buck converter. Since a number of laser modules which corresponds to the number of cylinders in the internal combustion engine is intended to be supplied from this energy supply, selector switches connected in series with the laser modules are provided which, owing to the very high currents of up to 250 A, need to be configured to be correspondingly heavy duty and are therefore costly.

In order to switch on and off series-connected light-emitting diodes for backlighting in displays, it is known from German utility model DE 11 2010 005 040 T5 (corresponding to U.S. Pat. Nos. 8,314,572, 8,378,957, 8,581,810 and 8,493,300) to regulate the current through the light-emitting diodes by a linear current regulator to a preset value and to regulate the voltage at an MOS transistor acting as an actuating element to a value just above the triode range. In this case, however, very complex voltage regulation is performed, which, in addition to the mentioned adjustment of the voltage at the actuating element transistor, includes power factor correction on a merely rectified, but not yet smoothed AC voltage signal.

For the actuation of piezoelectric actuators used as fuel injection valves, high voltages are required in order to enable quick charging and therefore a short injection time. The voltages realized at present of approximately 200 to 250 V and the charge regulation required for a precise injection quantity is realized, in accordance with European patent EP 1 139 443 B1 (corresponding to U.S. patent publication No. 2003/0205949), by use of a boost converter, which generates the high voltage from the voltage of the motor vehicle battery of approximately 12 to 14 V, and a downstream buck converter as switched current regulator.

SUMMARY OF THE INVENTION

The object of the invention, in contrast, consists in specifying an apparatus for operating at least one light-emitting diode which enables sufficient power for pumping laser spark plugs at low current.

The object is achieved by an apparatus for operating at least one light-emitting diode in the form of a laser diode. The light-emitting diode is interconnected in series with the load section of a controllable semiconductor element and a current measuring resistor between a first supply voltage terminal and a second supply voltage terminal. The supply voltage terminals are the output connections of a voltage-regulating circuit in the form of a DC voltage boost converter which provides a supply voltage. A current-regulating circuit is provided for the current through the at least one light-emitting diode, whose actuator is the controllable semiconductor element.

In an inventive manner, the apparatus for operating the laser diode has a DC voltage boost converter, which steps up the voltage of a motor vehicle battery from approximately 12 to 14 V rated voltage to an operating voltage of approximately 200 V, as a result of which the operating current can be reduced to 20 A. There are numerous inexpensive semiconductors available for this voltage/current range, with the result that particularly advantageous operation can be achieved in this case. By virtue of the apparatus according to the invention, the operating current for a laser module of approximately 10 A is provided for the duration of 300 µs from a storage capacitor, which is connected to the output of the voltage-regulating circuit. This is possible without any problems using conventional electrolytic capacitors. The DC voltage boost converter operates continuously and only needs to deliver the energy drawn from the storage capacitor subsequently. The continuous power is in this case 100 W, for example. This DC voltage boost converter is used with respect to the laser current pulses as an active filter for the vehicle electrical distribution system. Only its triangular operating current of, for example, 10 A makes filtering of the battery feed line necessary, albeit at substantially less cost, than would be necessary at currents of from 200 to 250 A.

Since the operating voltage of laser diodes fluctuates depending on temperature, aging, manufacturing tolerances, etc., it is expedient to supply the laser by means of current regulation, wherein the battery voltage then comes about. Since the voltage at the storage capacitor of the DC voltage boost converter cannot be changed quickly enough, in a first embodiment according to the invention a voltage converter operating as a step-down regulator is connected between the output capacitor of the voltage-regulating circuit and the laser module. The controlled variable is in this case the current through the laser module. In accordance with the invention, the current-regulating circuit is in the form of a switched buck converter, wherein the load section of the controllable semiconductor element is interconnected in series with a storage coil between the first supply voltage terminal and the anode of the at least one light-emitting diode—the laser diode or the multiplicity of laser diodes connected in series as a laser module—and a freewheeling element between the connecting node between the controllable semiconductor element and the storage coil and the second supply voltage terminal, and a first regulator is connected to the control connection of the controllable semiconductor element and that connection of the current measuring resistor which is not connected to the second supply voltage terminal.

In an advantageous development of the invention, at least two light-emitting diodes are provided, which are each connected in series with a drivable selector switching element and are connected with their anodes to the storage coil, wherein that connection with the respective selector switching element which is not connected to the light-emitting diode is connected to the current measuring resistor.

Since, when using the light-emitting diode as a pumped laser for laser spark plugs, one such pumped laser is required per laser spark plug, but only one ever needs to be active during operation, the pumped lasers can be connected in parallel in an advantageous manner and can be selected by selector switches connected in series with the respective laser diodes.

As a result, only one apparatus is required for operating a plurality of such laser modules, and only one current measuring resistor is required since in each case a current flows only through one of the laser modules.

If the voltage differences between the individual laser modules are sufficiently low, it is possible to dispense with switched current regulation and to replace it with linear regulation. In an advantageous design of the invention, therefore, the current-regulating circuit is in the form of a linear current-regulating circuit and has a second regulator, whose one input is connected to that connection of the current measuring resistor which is not connected to the second supply voltage terminal and whose other input is connected to a reference voltage, and whose output is connected to the control input of the controllable semiconductor element.

In an advantageous development of this embodiment, at least two light-emitting diodes are provided, which are each connected in series with a controllable semiconductor element and are connected with their anodes to the first supply voltage terminal. Wherein that connection of the respective controllable semiconductor element which is not connected to the light-emitting diode is connected to that connection of the current measuring resistor which is not connected to the second supply voltage terminal, and wherein a first multiplexer is provided, via which the output of the second regulator is connected to the control inputs of the at least two controllable semiconductor elements.

Advantageously, the selector transistors, in the case of laser modules connected in parallel with one another, can be used as actuating elements for the linear current-regulating circuit. In this case, the laser module which is intended to be activated is first established by the multiplexer and second the regulator is connected to the assigned selector switch acting as actuating element.

In a development of this embodiment of the invention, the connecting nodes of the at least two light-emitting diodes and the semiconductor elements assigned thereto are connected via a second multiplexer to a first input connection of a third regulator of the voltage-regulating circuit.

The voltage-regulating circuit ensures that the voltage at the actuating element of semiconductor elements or the selector semiconductor elements is regulated to a preset minimum value or does not fall below this value. As a result, first all of the laser modules are operated at a regulated current and, at the same time, the voltage at the selector semiconductor elements, operated as current sources, is as low as possible so as to avoid unnecessary power losses.

In one development of this embodiment, the series circuit containing a first and a second voltage divider resistor is interconnected between the supply voltage terminals, the node of the series circuit being connected to a second input connection of the third regulator of the voltage-regulating circuit. This makes it possible to ensure that the output voltage of the voltage-regulating circuit does not exceed a preset maximum value, as a result of which unnecessary power losses are avoided.

Other features which are considered as characteristic for the invention are set forth in the appended claims.

Although the invention is illustrated and described herein as embodied in an apparatus for operating at least one light-emitting diode in the form of a laser diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following

DETAILED DESCRIPTION OF THE INVENTION

Figure 1:
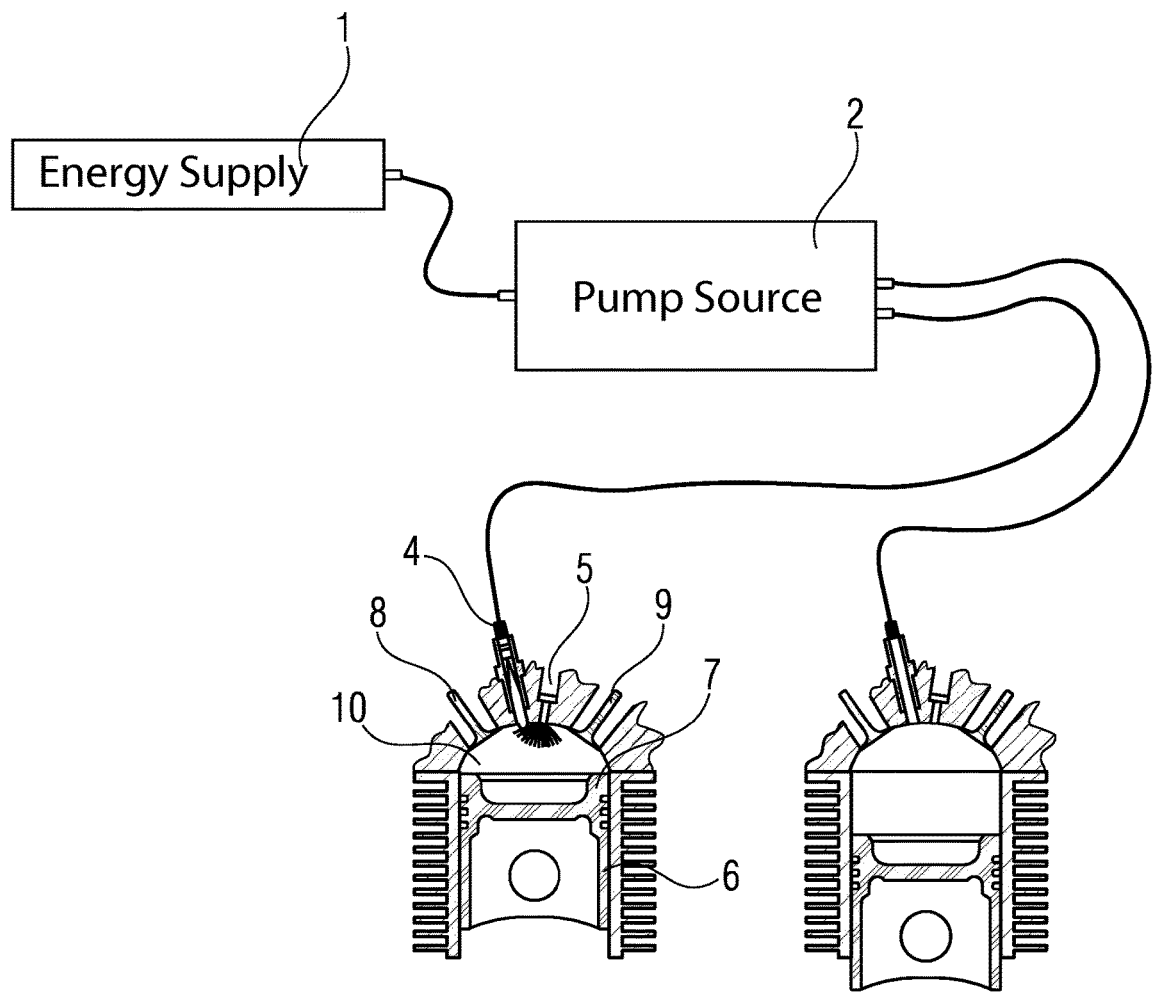
FIG. 1 is a schematic illustration of an ignition in a combustion chamber of a cylinder of an internal combustion engine by a laser spark plug.

Referring now to the figures of the drawings in detail and first, particularly to FIG. 1 thereof, there is shown schematically, in a manner representative of a spark ignition internal combustion engine, two cylinders 6, in which a piston 7 can move to and fro in order to drive, via a non-illustrated connecting rod, a crankshaft (likewise not illustrated). A combustion chamber 10 into which, first, fuel can be injected by a fuel injector 5 is arranged above the piston 7, which fuel, together with a quantity of air which is controllable by an inlet valve 8, produces a combustible mixture, which is intended to be ignited by a laser spark plug 4. The combustion exhaust gases are discharged by an outlet valve 9. Thus, ignition by the laser spark plug in a conventional internal combustion engine, which is operating on the basis of the Otto principle, is represented.

The laser spark plugs 4 of the individual cylinders 6 are connected to a pump source 2 via suitable glass fibers 3, which pump source 2 is connected to an energy supply 1. The pump source 2 is operated, in accordance with the current prior art, usually by semiconductor lasers, which are implemented as laser modules by laser diodes connected in series, and emit pulses of approximately 300 µs in duration to the laser spark plug, in which a solid-state laser is installed. In order to generate these pumped laser light pulses, the pumped laser 2 needs to be driven in a suitable manner.

Figure 2:
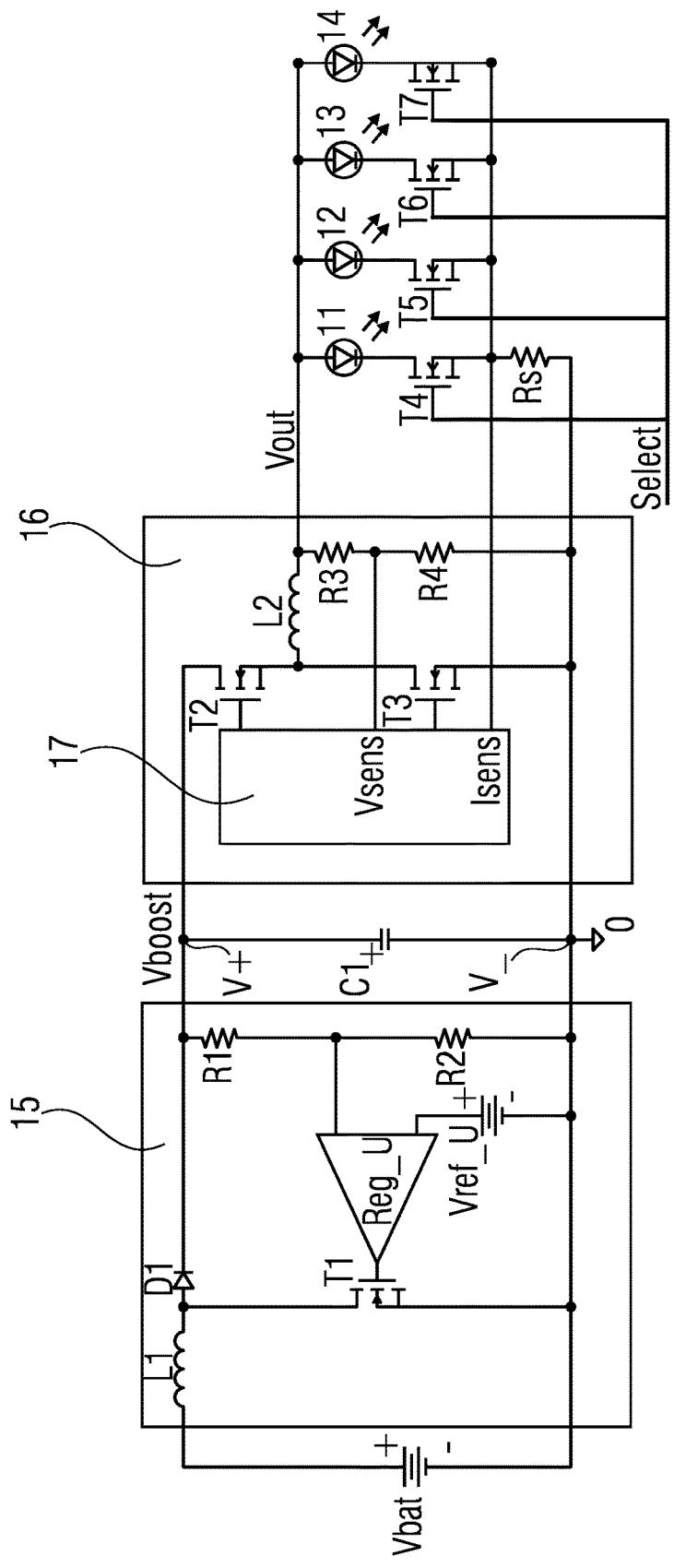
FIG. 2 is a circuit diagram showing a first embodiment of an apparatus according to the invention for operating a light-emitting diode.

A first apparatus according to the invention for operating such a laser diode module, which is merely referred to below as a laser diode, is illustrated in FIG. 2. In FIG. 2, a supply voltage Vboost is obtained at output terminals V+ and V− from the voltage Vbat, for example of a motor vehicle battery, which has a rated value of approximately 12 to 14 V, by a boost converter 15. The output terminals act as first supply voltage terminal V+ and second supply voltage terminal V− for the downstream laser diodes 11, 12, 13, 14 and the current-regulating circuit 16 assigned thereto.

The voltage-regulating circuit 15 is in the form of a conventional boost converter, containing a first coil L1, which is connected to the positive terminal of the motor vehicle battery and, with its other connection, is connected to the output connection or the first voltage supply terminal V+ via a first diode D1 with polarity in the forward direction. The node between the first coil L1 and the first diode D1 is connected to the negative terminal of the motor vehicle battery, which forms a reference potential GND, via a first switching element T1 in the form of a MOS transistor, in the exemplary embodiment illustrated. First a storage capacitor C1 is installed between the supply voltage terminals V+, V−, and second a first voltage divider containing a first resistor R1 and a second resistor R2 is connected. The center tap of the first voltage divider R1, R2 is connected to a first input of a third regulator Reg_U, whose second input is connected to a reference voltage Vref_. The output of the third regulator Reg_U is connected to the control connection of the first switching element T1. By virtue of the conventional boost converter circuit, the output voltage Vboost is regulated to a value which is proportional to the reference voltage Ref_U.

In the exemplary embodiment illustrated in FIG. 2, four laser diodes 11, 12, 13, 14 are connected in parallel with one another, wherein, as has already been mentioned, these laser diodes are in the form of laser modules and are formed by a number of semiconductor laser diodes connected in series.

Since these laser diodes 11, 12, 13, 14 are intended to be used as a pumped laser for laser spark plugs in an internal combustion engine, in each case only one is in operation. For this purpose, respectively assigned selector switches T4, T5, T6, T7 are connected in series with the laser diodes 11, 12, 13, 14, wherein that connection of the selector switches which is not connected to the respectively assigned laser diode 11, 12, 13, 14 are connected to a common current measuring resistor Rs, whose connection which is not connected to the selector switches T4, T5, T6, T7 is connected to the second supply voltage terminal V−. The control connections of the selector switches T4 to T7 are connected to a selector line Select in a manner illustrated schematically.

A switched current-regulating circuit 16 is in the form of a conventional switched buck converter and is formed with a controllable semiconductor element T2, which is first connected to the first supply voltage terminal V+ and second to the anodes of the laser diodes 11 to 14 via a second coil L2. The connecting node between the semiconductor switching element T2 and the second coil L2 is connected to the second supply voltage terminal V− via a freewheeling element T3 in the form of a MOS transistor. A first regulator 17 is first connected to the control connections of the first semiconductor element T2 and the freewheeling element T3. The first regulator 17 also has inputs, of which a first input Isens is connected to that connection of the current measuring resistor Rs which is not connected to the second supply voltage terminal V−. A second input Vsens is connected to the center tap of a voltage divider containing a third resistor R3 and a fourth resistor R4, which is interconnected between the node between the second coil L2 and the anodes of the laser diodes 11 to 14 and the second supply voltage potential V−.

The apparatus according to the invention in accordance with the first exemplary embodiment illustrated in FIG. 2 is operated in such a way that, first, the voltage of the motor vehicle battery Vbat is stepped up to a voltage at the supply voltage terminals V+, V− of approximately 200 V by the voltage-regulating circuit 15 and then is applied to the laser diodes 11 to 14 via the current-regulating circuit 16, which is in the form of a buck converter, wherein the current flowing through a respectively selected diode 11 to 14 is regulated by the current-regulating circuit 16 to a preset value and the voltage present at the laser diodes 11 to 14 is adjusted correspondingly.

Figure 3:
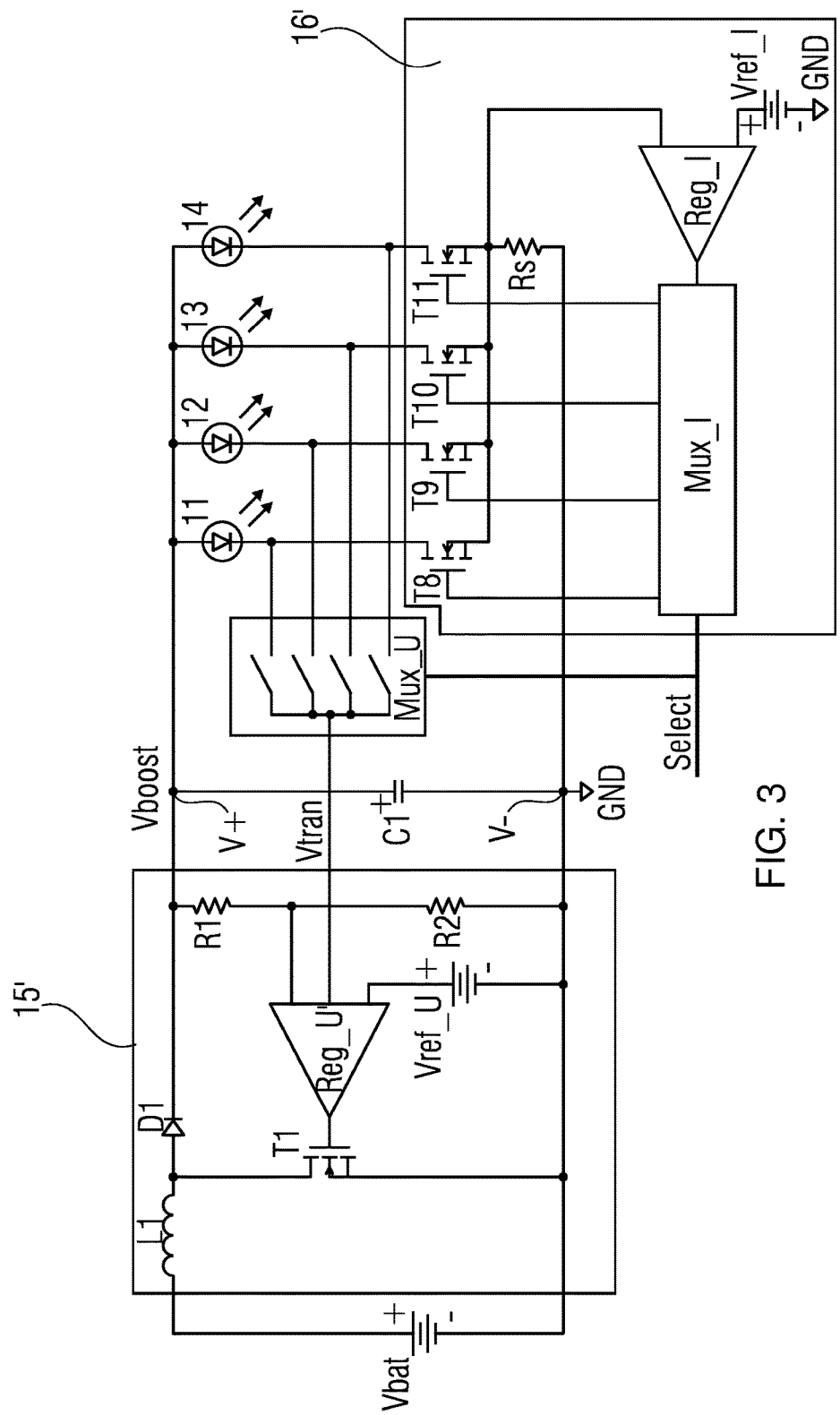
FIG. 3 is a circuit diagram showing a second embodiment of the apparatus.

In contrast to the exemplary embodiment in FIG. 2, in which a switched current regulation takes place, the exemplary embodiment in FIG. 3 shows a linear current regulation. In this case too, first the voltage of the motor vehicle battery Vbat is transformed into a high voltage present at supply voltage connections V+, V− of approximately 200 V by the voltage regulator 15, which is in the form of a boost converter. In FIG. 3, component parts corresponding to FIG. 2 are provided with the same reference signs.

In the case of the voltage regulator 15', the voltage divider containing the first resistor R1 and the second resistor R2 is not used for the regulation of the supply voltage Vboost, however, but is merely used for limiting this voltage to a preset maximum value. The actual regulation is described further below.

In the exemplary embodiment in FIG. 3, the supply voltage Vboost is applied directly to the laser diodes 11 to 14, which are in turn connected in parallel. The laser diodes 11 to 14 are in turn connected in series with respectively assigned controllable semiconductor elements T8 to T11, wherein those connections of the controllable semiconductor elements T8 to T11 which are not connected to the respective laser diode 11 to 14 are connected to the current measuring resistor Rs via a common connection, while the respective other connection is connected to the second supply voltage terminal V−.

In the exemplary embodiment in FIG. 3, the controllable semiconductor elements T8 to T11 act not only as selector switches, but also as actuating elements in the current-regulating circuit 16', which is formed by a second regulator Reg_I and a downstream first multiplexer Mux_I. A first input of the second regulator Reg_I is connected to that connection of the current measuring resistor Rs which is not connected to the second supply voltage terminal V−, while the other connection is connected to a reference voltage Vref_I, which is proportional to a preset current value which is intended to flow through the laser diodes 11 to 14.

First a laser diode 11 to 14 to be operated is selected via the first multiplexer Mux_I by corresponding connecting lines to the control connections of the controllable semiconductor elements T8 to T11 and second the semiconductor element T9 to T11 is used as actuating element in a current-regulating circuit, wherein in this case, in contrast to the embodiment in FIG. 2, linear current regulation takes place, however.

The connecting nodes between the laser diodes 11 to 14 and their respectively assigned controllable semiconductor elements T8 to T11 are connected to an input of the first regulator Reg_U' of the current-regulating circuit 15' via a second multiplexer Mux_U, wherein the supply voltage Vboost is regulated in such a way that the voltage at the respectively selected controllable semiconductor element T8 to T11 is adjusted to a preset minimum value, or does not fall below this minimum value, with the result that the controllable semiconductor elements are each operated in the linear range. The first and second multiplexers Mux_I, Mux_U are set via a selector line Select, which is only illustrated schematically, in such a way that the required laser diode 11 to 14 is selected, the current flowing through the laser diode is regulated and the voltage applied is likewise regulated.

By virtue of the apparatuses according to the invention for operating at least one laser diode, which is intended to act as pumped laser for a laser spark plug in an internal combustion engine of a motor vehicle, an inexpensive implementation is proposed since, owing to a high operating voltage, only a low current is required to achieve a preset power and therefore it is possible to dispense with correspondingly expensive switching transistors and filter elements, as are required at high currents.

The invention claimed is:

1. An apparatus for operating at least one light-emitting diode in a form of a laser diode, the apparatus comprising:
   a current-regulating circuit for regulating a current running through the at least one light-emitting diode, said current-regulating circuit having an actuator being a controllable semiconductor element with a load section, the light-emitting diode being interconnected in series with said load section of said controllable semiconductor element;
   a voltage-regulating circuit having first and second supply voltage terminals being output connections of said voltage-regulating circuit, said voltage-regulating circuit being a DC voltage boost converter outputting a supply voltage; and
   a current measuring resistor connected between said first supply voltage terminal and said second supply voltage terminal;
   said current-regulating circuit having a storage coil, a first regulator and a freewheeling element; and
   wherein said current-regulating circuit is a switched buck converter, said load section of said controllable semiconductor element is interconnected in series with said storage coil between said first supply voltage terminal and an anode of the at least one light-emitting diode and said freewheeling element is connected between a connecting node between said controllable semiconductor element and said storage coil and said second supply voltage terminal, said first regulator is connected to a control connection of said controllable semiconductor element and that connection of said current measuring resistor which is not connected to said second supply voltage terminal.

2. The apparatus according to claim 1,
   further comprising drivable selector switching elements; and
   wherein the at least one light-emitting diode is one of at least two light-emitting diodes which are each connected in series with one of said drivable selector switching elements and are connected with their anodes to said storage coil, wherein a connection with said drivable selector switching elements which is not connected to the light-emitting diode is connected to said current measuring resistor.

3. An apparatus for operating at least one light-emitting diode in a form of a laser diode, the apparatus comprising:
   a current-regulating circuit for regulating a current running through the at least one light-emitting diode, said current-regulating circuit having an actuator being a controllable semiconductor element with a load section, the light-emitting diode being interconnected in series with said load section of said controllable semiconductor element;
   a voltage-regulating circuit having first and second supply voltage terminals being output connections of said voltage-regulating circuit, said voltage-regulating circuit being a DC voltage boost converter outputting a supply voltage; and
   a current measuring resistor connected between said first supply voltage terminal and said second supply voltage terminal;
   wherein said current-regulating circuit is a linear current-regulating circuit and has a regulator with a first input connected to said a connection of said current measuring resistor which is not connected to said second supply voltage terminal, a second input connected to a reference voltage, and an output connected to a control input of said controllable semiconductor element.

4. The apparatus according to claim 3, wherein:
   said controllable semiconductor element is one of a plurality of controllable semiconductor elements having control inputs;

the at least one light-emitting diode is one of at least two light-emitting diodes, the at least two light-emitting diodes are each connected in series with one of said controllable semiconductor elements and are connected with their anodes to said first supply voltage terminal, wherein that connection of said controllable semiconductor element which is not connected to the light-emitting diode is connected to that connection of said current measuring resistor which is not connected to said second supply voltage terminal; and said current-regulating circuit has a first multiplexer via which said output of said regulator is connected to said control inputs of at least two of said controllable semiconductor elements.

5. The apparatus according to claim 4, further comprising a second multiplexer;

wherein said voltage-regulating circuit has a further regulator with a first input connection; and wherein connecting nodes of the at least two light-emitting diodes and said controllable semiconductor elements assigned thereto are connected via said second multiplexer to said first input connection of said further regulator of said voltage-regulating circuit.

6. The apparatus according to claim 5, wherein said voltage-regulating circuit has a series circuit containing a first and a second voltage divider resistor interconnected between said first and second supply voltage terminals, a node of said series circuit being connected to a second input connection of said further regulator of said voltage-regulating circuit.

7. The apparatus according to claim 1, wherein the light-emitting diode acts as a pumped laser for a laser spark plug for internal combustion engines.

8. The apparatus according to claim 3, wherein the light-emitting diode acts as a pumped laser for a laser spark plug for internal combustion engines.

* * * * *